United States Patent [19]

Yatsuda et al.

[11] Patent Number: 4,501,819

[45] Date of Patent: Feb. 26, 1985

[54] GLASS FOR A PHOTOMASK

[75] Inventors: Hisao Yatsuda; Mutsumi Miyazaki, both of Sagamihara, Japan

[73] Assignee: Kabushiki Kaisha Ohara Kogaku Garasu Seizosho, Kanagawa, Japan

[21] Appl. No.: 561,750

[22] Filed: Dec. 15, 1983

[30] Foreign Application Priority Data

Dec. 23, 1982 [JP] Japan ............................. 57-224957
Sep. 26, 1983 [JP] Japan ............................. 58-176477

[51] Int. Cl.³ .......................... C03C 3/08; C03C 3/10
[52] U.S. Cl. ..................................... 501/61; 501/62
[58] Field of Search ................................ 501/61, 62

[56] References Cited

U.S. PATENT DOCUMENTS 3,485,644 12/1969 Shonebarger ..................... 501/61
4,319,215 3/1982 Yamazaki et al. ................. 501/61
4,391,916 7/1983 Nakagawa et al. ................ 501/62
4,403,043 9/1983 Nakagawa et al. ................ 501/62

FOREIGN PATENT DOCUMENTS 1338386 11/1973 United Kingdom ................. 501/32
647269 2/1979 U.S.S.R. .......................... 501/61

Primary Examiner—Mark Bell
Attorney, Agent, or Firm—Ladas & Parry

[57] ABSTRACT

According to one aspect of the invention, there is provided glass for a photomask consisting, in weight percent, of 45 to 62% $SiO_2$, 3 to 15% $B_2O_3$, 12 to 25% $Al_2O_3$, 5 to 15% MgO, 0 to 5% CaO, 0 to 5% SrO, 0 to 5% BaO, 0 to 5% ZnO, 0.5 to 5% PbO, 0 to 20% $La_2O_3+Gd_2O_3+Y_2O_3$, 0 to 1.5% $Na_2O$, 0 to 1.5% $K_2O$, 0 to 0.5% $As_2O_3$ and 0 to 6% $Sb_2O_3$. This glass is easy to melt and homogenize and has good resistivity to phase separation and excellent heat resisting and refractory properties, chemical durability, ultraviolet transmittance and metal vapor deposition property. According to another aspect of the invention, there is provided glass for a photomask consisting, in weight %, 45 to 60% $SiO_2$, 0.5 to 12% $B_2O_3$, 10 to 22% $Al_2O_3$, 5 to 17% MgO, 0 to 5% CaO, 0 to 8% SrO, 1.5 to 15% BaO, 1.5 to 17% ZnO, 0.5 to 10% PbO, the total content of ZnO and PbO being at least 6%, 0 to 7% $Ta_2O_5+Nb_2O_5+La_2O_3+Gd_2O_3+Y_2O_3+Bi_2O_3+WO_3$, 0 to 5% $ZrO_2+TiO_2$, 0 to 2.5% $Na_2O+K_2O+Li_2O$, 0 to 0.5% $As_2O_3$ and 0 to 0.5% $Sb_2O_3$. This glass has the same excellent features as the first described glass and, in addition, has further improved melt properties.

1 Claim, 1 Drawing Figure

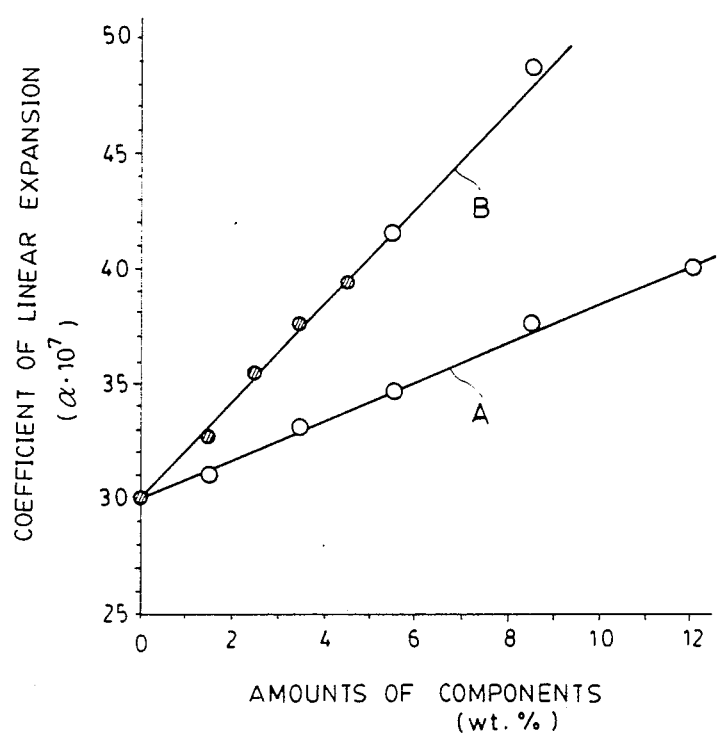

GLASS FOR A PHOTOMASK

FIELD OF THE INVENTION

The present invention relates to glass suitable for use as a photomask used in the production of integrated circuits. More particularly, the present invention relates to glass for a photomask of a $SiO_2$-$B_2O_3$-$Al_2O_3$-MgO-PbO system having coefficient of linear expansion ($\alpha \times 10^7$) within the range of about 33 to 40 and dilatometric softening temperature of more than about 750° C. and having excellent heat resisting, refractory and melt properties, good resistivity to phase separation, and excellent chemical durability and ultraviolet transmittance. The invention also relates to glass for a photomask of a $SiO_2$-$B_2O_3$-$Al_2O_3$-MgO-BaO-ZnO-PbO system having improved melt properties while maintaining the excellent properties of the above described glass of the $Sio_2$-$B_2O_3$-$Al_2O_3$-MgO-PbO system.

BACKGROUND OF THE INVENTION

Glass masks for photoetching used in the production of integrated circuits are required to have a high optical homogeneity free of defects such as bubbles, cords and contaminants. They are also required to have a high stability and, for obtaining a high degree of integration in the integrated circuits, a small coefficient of thermal expansion. Further, they must have good heat resisting and refractory properties so as not to cause breakage or deformation in the heating cycle in the process for vapor-depositing metal on the mask, excellent chemical durability to washing and etching by various chemicals, an excellent ultraviolet transmittance and good adhesion of a metal vapor-deposited film with which an integrated circuit pattern is formed on the mask.

Known in the art of glasses for photomask is a Pyrex type boro-silicate glass. The glass, however, requires a high temperature in melting and is difficult to homogenize. Besides, this glass is inferior in the adhesion of the metal vapor-deposited film due to its high alkali content and is not sufficient in the refractory property, softening temperature being less than about 650° C. Known also in the art are calcium-alumino-silicate glasses of the fibre E and refractory glass types. These glasses have improved melt properties over the above described boro-silicate glass but have the disadvantage that they must contain a relatively large amount of CaO with a result that the heat resisting properties are unsatisfactory with a relatively large coefficient of thermal expansion of about 42 to 65 ($\alpha \times 10^7$).

There are also disclosed $SiO_2$-$Al_2O_3$-CaO-MgO-ZnO-PbO glass compositions in the specifications of U.S. Pat. Nos. 4,391,916 and 4,403,043. These glasses also must contain a large amount of CaO for maintaining the stability of the glass resulting in a relatively large coefficient of thermal expansion which is more or less similar to the calcium-alumino silicate glass.

SUMMARY OF THE INVENTION

It is, therefore, an object of the present invention to provide glass for a photomask which has eliminated the above described disadvantages of the prior art glasses and is easy to homogenize and has excellent heat resisting and refractory properties, chemical durability and ultraviolet transmittance.

Laborious studies and experiments made by the inventors of the present invention have resulted in the finding that a magnesium-alumino-boro-silicate glass which has been known to have a strong opacity due to phase separation and therefore has not been expected to stably provide a glass of good transparency has a composition range in which, surprisingly, a stable glass which is substantially free from the phase separation can be obtained.

Various alumino-silicate glasses ranging over a wide variety of compositions have heretofore been known. Among them, there are not a few compositions which have devitrification and phase separation tendencies. The specification of Japanese Patent Publication No. 2631/1972 (the specification of BP No. 1,338,386) discloses a special composition of such alumino-silicate glass which provides the glass with opacity due to the phase separation, i.e., a composition consisting, in weight percent, of 55 to 70% $SiO_2$, 1.6 to 8.3% $B_2O_3$, 7 to 23% $Al_2O_3$, 6.7 to 16.5% MgO, 0 to 5% CaO, 0 to 5% ZnO, 0 to 6% PbO, 0 to 6% $SnO_2$, 0 to 6% $TiO_2$ and 0 to 6% $ZrO_2$. This composition is described to be capable of affording sufficient opacity to the glass irrespective of contents of $SnO_2$, $TiO_2$ and $ZrO_2$ which are generally known to be opacifiers. It has however been found by the inventiors of the present invention that if contents of $SiO_2$, $B_2O_3$, $Al_2O_3$ and PbO in the above glass composition are limited respectively to specific ranges, the glass becomes substantially resistive to phase separation and there is a composition range of a very stable transparent glass centering on this limited glass composition which meets the above described requirements of the glass for a photomask.

In the first aspect of the invention, therefore, there is provided glass for a photomask consisting, in weight percent, of 45 to 62% $SiO_2$, 3 to 15% $B_2O_3$, 12 to 25% $Al_2O_3$, 5 to 15% MgO, 0 to 5% CaO, 0 to 5% SrO, 0 to 5% BaO, 0 to 5% ZnO, 0.5 to 5% PbO, 0 to 20% $La_2O_3+Gd_2O_3+Y_2O_3$, 0 to 1.5% $Na_2O$, 0 to 1.5% $K_2O$, 0 to 0.5% $As_2O_3$ and 0 to 6% $Sb_2O_3$.

As will be described later, the $SiO_2$-$B_2O_3$-$Al_2O_3$-MgO-ZnO-PbO system glass is herein presented as a preferable glass for use in the production of a photomask. It has been found, however, that in this glass which has achieved a sufficiently small coefficient of thermal expansion, the necessity for maintaining the stability of the glass causes the amount of the components contributing to melting of the glass to be limited to a rather small one except in a case where such expensive material as $La_2O_3$ is employed and, for this reason, this glass leaves some room for improvement in respect of melt properties for maintaining a higher degree of homogeneity which is desirable for glass for a photomask.

It is, therefore, a second object of the present invention to provide glass for a photomask which has improved melt properties over the glass provided in the first aspect of the invention while maintaining its excellent properties of this glass as described above.

For achieving the second object of the invention, the inventors have made experiments on the basis of the glass of the $SiO_2$-$B_2O_3$-$Al_2O_3$-MgO-ZnO system which has been found preferable in the first aspect of the invention but employing, as an essential component, BaO which has been used only as an optional component in the glass of the first aspect of the invention. As a result, it has been found that the introduction of BaO as the essential component remarkably improves the stability of the glass while lowering the coefficient of thermal expansion as compared with a case where CaO which constitutes an essential component for a conventional refractory glass is introduced. It has also been found that the introduction of BaO enables the amount of addition of ZnO and PbO contents which contribute to melting of the glass to be increased substantially.

In the second aspect of the invention, therefore, there is provided glass for a photomask consisting, in weight %, of 45 to 60% $SiO_2$, 0.5 to 12% $B_2O_3$, 10 to 22% $Al_2O_3$, 5 to 17% MgO, 0 to 5% CaO, 0 to 8% SrO, 1.5 to 15% BaO, 1.5 to 17% ZnO, 0.5 to 10% PbO, the total content of ZnO and PbO being at least 6%, 0 to 7% $Ta_2O_5+Nb_2O_5+La_2O_3+Gd_2O_3+Y_2O_3+Bi_2O_3+WO_3$, 0 to 5% $ZrO_2+TiO_2$, 0 to 2.5% $Na_2O+K_2O+Li_2O$, 0 to 0.5% $As_2O_3$ and 0 to 0.5% $Sb_2O_3$.

BRIEF DESCRIPTION OF THE DRAWING

The FIGURE is a graph relating to the second aspect of the invention in which effects on coefficient of thermal expansion and stability of the glass by adding BaO and CaO respectively to the glass of the $SiO_2$-$B_2O_3$-$Al_2O_3$-MgO-ZnO-PbO system are shown for comparison.

DETAILED DESCRIPTION OF THE INVENTION

In the glass made according to the first aspect of the invention, the above described composition is selected for reasons stated below.

$SiO_2$ is effective for increasing the heat resisting property and chemical durability of the glass and the content thereof should be 45% or more. If, however, the content of $SiO_2$ exceeds 62%, the melt properties deteriorate and hence a homogeneous glass is hard to obtain.

If the content of $B_2O_3$ is small, the phase separation tendency of the glass appreciably increases and the melt properties decreases. If, on the other hand, the content of $B_2O_3$ is excessively large, the softening temperature is lowered and a desired refractory property cannot be maintained. For these reasons, the content of $B_2O_3$ must be within the range from 3 to 15%.

$Al_2O_3$ is useful for preventing the phase separation of the glass and affording a desired refractory property to the glass. For obtaining these effects, the content of $Al_2O_3$ should be at least 12%. If, however, the content exceeds 25%, the melt properties of the glass deteriorate.

MgO is effective for increasing the melt properties without increasing coefficient of thermal expansion of the glass as compared with the other divalent metal components. If the content of MgO is less than 5%, these effects cannot be obtained sufficiently, whereas if the content thereof exceeds 15%, the glass tends to become opaque.

CaO, SrO and BaO are optional components which respectively contribute to improving the melt properties of the glass. If the content of each of these components exceeds 5%, the coefficient of thermal expansion of the glass becomes excessively large and the phase separation tendency arises.

ZnO is an optional component which is effective for improving chemical durability and grindability of the glass. If the content of ZnO exceeds 5%, the glass tends to become opaque due to phase separation. Since use of ZnO not exceeding 5% not only brings about the above effects but also contributes to prevent opacity due to the phase separation and improve melt properties without excessively increasing the coefficient of thermal expansion, it is desirable that ZnO of at least 5% should be included in the glass composition and the glass be treated as glass of a $SiO_2$-$B_2O_3$-$Al_2O_3$-MgO-ZnO-PbO system.

In the glass of the present invention, PbO is an important component because it is useful for improving melt properties and preventing phase separation. If the content of PbO is less than 0.5%, such effects cannot be achieved sufficiently, whereas if the content exceeds 5%, the coefficient of thermal expansion of the glass becomes excessively large.

$La_2O_3$, $Gd_2O_3$ and $Y_2O_3$ respectively contribute to increasing melt properties of the glass and can be optionally included in the glass. If, however, the total content of one or more of these components exceeds 20%, the melt properties of the glass are found to deteriorate rather than improve.

$Na_2O$ and $K_2O$ can be optionally included in the glass to improve melt properties. The content of each of these components should preferably be less than 1.5% for maintaining a good adhesion of the metal film on the glass and a small coefficient of thermal expansion.

$As_2O_3$ can be optionally added to the glass up to the content of 0.5% as a refining agent in the melting process.

$Sb_2O_3$ works effectively as a flux without adversely affecting the heat resisting property of the glass and it also works partially as a refining agent. The content of $Sb_2O_3$ up to 6% suffices for these purposes.

Since $La_2O_3$ and/or $Sb_2O_3$ contribute to the improvement of homogeneity in melting of the glass while preventing opacity due to the phase separation, the total content of 0.5% or more of one or both of these components should preferably be added to the glass.

If necessary, one or more of $TiO_2$, $ZrO_2$, $Bi_2O_3$, $Nb_2O_5$ and $Ta_2O_5$ may be included in the glass in addition to the above described components up to the total content of about 5% which is an allowable range within which tendencies to opacity due to the phase separation and tinting will not occur and melt properties will be maintained. If necessary, $Li_2O$ may be added to the glass as a part of the content of $Na_2O$ or $K_2O$ up to about 0.5% within an allowable range of the thermal expansion.

The following Table 1 illustrates examples of the glass according to the first aspect of the invention together with results of measurement of their coefficients of linear expansion ($\alpha(100°-300°\ C.)\times 10^7$), softening points (At), values of waterproof property (RW(P)) represented by decrease in weight (wt %) of crushed glass particles having a particle size of 420-590 μm after treating them for 60 minutes in a boiled water bath and ultraviolet transmittance (Tuv (%)) with thickness of the sample being 10 mm and wavelength employed in measurement being 340 nm. Table 1 illustrates also a conventional glass composition as a comparative example. With a view to testing opacity due to phase separation concurrently with other properties, samples of the glass example of Table 1 provided for the measurements were heat-treated at 900° C. for 20 minutes after melting and refining and then were cooled.

TABLE 1

(weight %)

| No. | Examples | | | | | | | | | | Comparative example |
|---|---|---|---|---|---|---|---|---|---|---|---|
| | 1 | 2 | 3 | 4 | 5 | 6 | 7 | 8 | 9 | 10 | A |
| $SiO_2$ | 54.2 | 57.5 | 58.5 | 62.0 | 53.0 | 61.0 | 52.0 | 46.5 | 46.5 | 45.0 | 66.5 |
| $B_2O_3$ | 15.0 | 10.0 | 7.0 | 5.0 | 11.7 | 6.0 | 12.0 | 15.0 | 10.0 | 7.5 | 8.5 |
| $Al_2O_3$ | 16.0 | 19.0 | 14.3 | 15.0 | 15.0 | 12.5 | 15.0 | 15.0 | 17.0 | 23.5 | 11.0 |
| MgO | 7.5 | 8.5 | 10.0 | 12.5 | 7.0 | 10.0 | 5.0 | 7.5 | 7.5 | 7.5 | 13.7 |
| CaO | | 1.5 | 0.7 | | 4.0 | 1.7 | 3.0 | 2.0 | 1.5 | 1.0 | 0.2 |
| SrO | 2.5 | | | | | | | | | | |
| BaO | | | 3.0 | 2.0 | | 3.5 | | | | | |
| ZnO | 2.5 | 0.5 | 1.5 | 0.7 | 2.0 | 2.5 | 1.0 | 0.5 | 1.0 | 2.0 | |
| PbO | 1.0 | 1.5 | 4.0 | 1.5 | 2.0 | 0.5 | 2.0 | 1.0 | 1.0 | 3.0 | |
| $La_2O_3$ | | | | | | | 6.0 | | 15.0 | | |
| $Gd_2O_3$ | | | | | | | | | | 10.0 | |
| $Y_2O_3$ | | | | | | | | 12.0 | | | |
| $Na_2O$ | | 1.0 | | 0.5 | | | | | | | 0.1 |
| $K_2O$ | 1.0 | | | 0.5 | | | | | | | |
| $As_2O_3$ | 0.3 | | | 0.1 | | | | | | | |
| $Sb_2O_3$ | | 0.5 | 1.0 | 0.2 | 5.3 | 2.3 | 4.0 | 0.5 | 0.5 | 0.5 | |
| $\alpha \times 10^7$ | 34 | 37 | 35 | 35 | 39 | 39 | 39 | 40 | 41 | 39 | |
| At (°C.) | 765 | 770 | 790 | 800 | 760 | 790 | 760 | 765 | 780 | 775 | |
| RW (P) | 0.04 | 0.02 | 0.04 | 0.02 | 0.05 | 0.02 | 0.05 | 0.05 | 0.04 | 0.05 | |
| Tuv (%) | 65 | 60 | 56 | 60 | 55 | 60 | 55 | 60 | 53 | 55 | 0 (opacified) |

As will be seen from Table 1, the examples of the glass made according to the first aspect of the present invention are all transparent without producing opacity as in the comparative example No. A and exhibit a high resistivity to phase separation and an excellent ultraviolet transmittance. The glasses of these examples exhibit also coefficient of linear expansion within the range from about 33 to 40 which are target values of the invention. The glasses of these examples have good heat resisting and refractory properties with the softening temperature exceeding 750° C. Further, the glasses of these examples have a good waterproof property.

Notwithstanding that the glasses of these example are alkali-free or low alkali alumino-silicate glass, they have such good melt properties that the homogenizing step can be facilitated.

The glass of the first aspect of the invention can be produced by weighing and mixing raw materials such as oxides, carbonates and nitrates in proportions required for obtaining a desired oxide glass composition, melting the mixture for homogenization at 1430° C. to 1530° C. in a conventional glass manufacturing apparatus, forming it to a desired shape and thereafter cooling it. The glass is not affected by variation in heating in the manufacturing process to give rise to opacity due to the phase separation whereby transparency and homogeneity of the glass are stably maintained.

Turning now to the second aspect of the invention, reasons for selecting the specified composition in the second aspect of the invention will be described.

$SiO_2$ is effective for increasing the heat resisting property and chemical durability of the glass and the content thereof should be 45% or more. If the content of $SiO_2$ exceeds 60%, the melt properties deteriorate and hence a homongeneous glass is hard to obtain.

$B_2O_3$ is useful for improving the melt properties and hence an essential component in the glass. If the content is less than 0.5%, this effect cannot be sufficiently achieved whereas if the content exceeds 12%, the softening temperature is lowered and the amount of volatilization of $B_2O_3$ in the melting step increases and hence the composition of the glass is subjected to variation.

The content of $Al_2O_3$ should be 10% or more for preventing the tendency to phase separation of the glass and obtaining a desired refractory property. If, however, the content exceeds 22%, the melt properties of the glass deteriorate.

MgO is effective for improving the melt properties without increasing the coefficient of thermal expansion of the glass but this effect cannot be sufficiently achieved if the content is less than 5%. If, on the contrary, the content exceeds 17%, the devitrification tendency occurs.

CaO and SrO are effective for improving the melt properties of the glass and hence may be optionally added. Different from the BaO component to be described later, however, CaO and SrO tend to increase the coefficient of thermal expansion excessively and besides have little effect for preventing the tendencies to phase separation and crystallization. The contents of these components, therefore, should not exceed 5% and 8% respectively.

In the second aspect of the invention, BaO constitutes an important component because it is found to have the effect for preventing the tendencies to phase separation and crystallization without excessively increasing the coefficient of thermal expansion and thereby stabilizing the glass. If, however, the content of BaO is less than 1.5%, these effects cannot be appreciably obtained, whereas if the content exceeds 15%, the melt properties of the glass deteriorate. The attached FIGURE illustrates the influences of the addition of BaO and CaO to the glass on the coefficient of thermal expansion and stability of the glass in cases where BaO and CaO have been respectively added to the basic glass composition of 53% $SiO_2$, 7% $B_2O_3$, 15% $Al_2O_3$, 12% MgO, 8% ZnO and 5% PbO and glasses have been produced from these mixtures in the same manner as in the examples to be described later. It will be noted from the FIGURE that the addition of a relatively small amount of BaO brings about a remarkable stabilizing effect without substantially increasing the coefficient of thermal expansion as compared with CaO and that the region of stabilization is fairly wide.

ZnO is also an important component because it improves the melt properties, chemical durability and grindability of the glass. If the content is less than 1.5%, these effects cannot be sufficiently obtained, whereas if the content exceeds 17%, the devitrification tendency occurs.

PbO is also an important component because it is effective for preventing the devitrification tendency while improving the melt properties. If the content is less than 0.5%, these effects cannot be sufficiently obtained, whereas if the content exceeds 10%, the chemical durability of the glass deteriorates.

In the glass of the second aspect of the invention which contains BaO as the essential component, the contents of ZnO and PbO having the effect of flux can be increased while preventing the devitrification tendency. The total content of ZnO and PbO should be 6% or more for improving the melt properties of the glass.

$Ta_2O_5$, $Nb_2O_5$, $La_2O_3$, $Gd_2O_3$, $Y_2O_3$, $Bi_2O_3$ and $WO_3$ are effective for lowering the coefficient of thermal expansion and increasing the melt properties and hence can be optionally included in the glass. A proper total content of one or more of these components is 7% or less.

$ZrO_2$ and $TiO_2$ can also be optionally included in the glass, for these components contribute to improving the chemical durability and the latter improves the melt properties and prevents the devitrification tendency. The total content up to 5% of one or both of these components is sufficient for achieving these effects.

$Na_2O$ and $K_2O$ can be optionally included for improving the melt properties of the glass. For maintaining a good adhesion of the metal film on the glass and a small coefficient of thermal expansion, the total content of one or both of these components should preferably be less than 2.5%. $Li_2O$ up to 0.5% also can be used as a part of these components.

$As_2O_3$ and $Sb_2O_3$ respectively up to 0.5% can be optionally included as refining agents in the melting process.

The following Table 2 illustrates examples of the glass according to the second aspect of the invention together with results of measurement of their coefficients of linear expansion, softening points (At), values of waterproof property, ultraviolet transmittance, values of acidproof property (RW (P)) represented by decrease in weight (wt %) of crushed glass particles having a particle size of 420–590 μm after soaking them in 0.01 N nitric acid solution and treating them for 60 minutes in a boiled water bath and temperature of the glass (T (° C.)) at the viscosity of $10^3$ poise.

Table 2 illustrates also two glass compositions listed in Table 2 (No. 2 and No. 4) as comparative examples. With a view to testing opacity due to phase separation concurrently with other properties, samples of the glass example of Table 2 provided for measurements were heat-treated after melting and refinings and then were cooled in the same manner as in the glasses of Table 1.

TABLE 2

| No. | Examples | | | | | | | | | |
|---|---|---|---|---|---|---|---|---|---|---|
| | 1 | 2 | 3 | 4 | 5 | 6 | 7 | 8 | 9 | 10 |
| $SiO_2$ | 53 | 55 | 55 | 50 | 52.5 | 55 | 52.5 | 55 | 55 | 55 |
| $B_2O_3$ | 7 | 5 | 5 | 10 | 5 | 5 | 2.2 | 1.5 | 2 | 4.7 |
| $Al_2O_3$ | 15 | 12 | 15 | 15 | 17.5 | 15 | 15 | 15 | 15 | 15 |
| MgO | 12 | 10 | 12 | 10 | 5.2 | 16 | 5 | 10 | 10 | 7.5 |
| BaO | 4 | 5 | 5.2 | 6 | 2.5 | 2.5 | 5 | 5 | 5 | 2.5 |
| ZnO | 7 | 8.5 | 2.5 | 6.2 | 12.5 | 5.7 | 15 | 10 | 8.3 | 7.5 |
| PbO | 1.7 | 4.2 | 5 | 2.5 | 2 | 0.5 | 5 | 2.2 | 2 | 7.5 |
| Other components | | | | | CaO 2.5 | | | CaO 0.5 $Na_2O$ 0.5 | $Ta_2O_5$ 2.5 $Sb_2O_3$ 0.2 | |
| $As_2O_3$ | 0.3 | 0.3 | 0.3 | 0.3 | 0.3 | 0.3 | 0.3 | 0.3 | | 0.3 |
| $\alpha(\times 10^7/°C.)$ | 35 | 35 | 36 | 36 | 36 | 39 | 29 | 38 | 33 | 29 |
| At (°C.) | 771 | 753 | 770 | 760 | 770 | 782 | 770 | 782 | 794 | 772 |
| RW (P) | 0.03 | 0.05 | 0.04 | 0.04 | 0.03 | 0.03 | 0.01 | 0.03 | 0.01 | 0.04 |
| RA (P) | 0.03 | 0.02 | 0.05 | 0.04 | 0.05 | 0.01 | 0.02 | 0.05 | 0.01 | 0.06 |
| Tuv (%) | 58 | 65 | 54 | 63 | 62 | 54 | 55 | 58 | 55 | 52 |
| T (°C.) | 1300 | 1330 | 1350 | 1310 | 1320 | 1330 | 1370 | 1340 | 1370 | 1350 |

(weight %)

| No. | Examples | | | | | | | | Comparative examples (Table 1) | |
|---|---|---|---|---|---|---|---|---|---|---|
| | 11 | 12 | 13 | 14 | 15 | 16 | 17 | 18 | 2 | 4 |
| $SiO_2$ | 55 | 53 | 58 | 45 | 50 | 53 | 53.5 | 52.5 | | |
| $B_2O_3$ | 5 | 3.2 | 5 | 2.5 | 3.7 | 2.6 | 5 | 2 | | |
| $Al_2O_3$ | 17.5 | 12.5 | 12 | 15 | 20 | 15 | 15 | 13 | | |
| MgO | 10 | 10 | 10 | 10 | 10 | 10 | 10 | 10 | | |
| BaO | 2 | 12.5 | 2.5 | 7.5 | 4.0 | 5 | 2.5 | 5 | | |
| ZnO | 8 | 7.5 | 10 | 12.5 | 10 | 10 | 10 | 10 | | |
| PbO | 2.2 | 1 | 2.2 | 2.4 | 2 | 2 | 1.2 | 2 | | |
| Other components | | | | $La_2O_3$ 5 | | $ZrO_2$ 2 $Li_2O$ 0.1 | $Gd_2O_3$ 2.5 | SrO 3 $TiO_2$ 2 | | |
| $As_2O_3$ | 0.3 | 0.3 | 0.3 | 0.1 | 0.3 | 0.3 | 0.3 | 0.5 | | |
| $\alpha(\times 10^7/°C.)$ | 32 | 40 | 30 | 38 | 33 | 34 | 33 | 38 | 36 | 35 |
| At (°C.) | 786 | 768 | 777 | 791 | 788 | 778 | 772 | 782 | 770 | 800 |
| RW (P) | 0.02 | 0.03 | 0.04 | 0.04 | 0.01 | 0.01 | 0.02 | 0.02 | | |
| RA (P) | 0.04 | 0.02 | 0.03 | 0.04 | 0.05 | 0.02 | 0.03 | 0.02 | | |
| Tuv (%) | 55 | 53 | 60 | 55 | 54 | 60 | 64 | 54 | | |
| T (°C.) | 1360 | 1350 | 1370 | 1290 | 1300 | 1350 | 1340 | 1330 | 1410 | 1430 |

The value of α varies depending upon the temperature range within which the measurement is made. In the case of the alumino-silicate glass including the glass of the present invention, the value of $\alpha$ in the temperature range of, e.g., 50°–200° C. is lower than that in the temperature range of, e.g., 100°–300° C. by about 3 to 5. In measuring the value of $\alpha$ for the glass of the present invention, the temperature range has been so selected that a relatively large value of $\alpha$ will be obtained.

As will be seen from Table 2, the examples of the glass made according to the second aspect of the invention are all stable and transparent without producing phase separation or crystallization. Besides, the glass according to the second aspect of the invention has excellent ultraviolet transmittance and waterproof and acidproof properties. Further, the coefficient of linear expansion of the examples of Table 2 are within the range from 28 to 40, some of these examples enjoying much lower coefficients than the examples of the first aspect of the invention. They have also good heat resisting and refractory properties with the softening temperature exceeding about 750° C.

Since the glasses according to the second aspect of the invention contains increased total content of ZnO and PbO by the introduction of BaO, the glasses have achieved a remarkable improvement in the melt properties notwithstanding that they are alkali-free or low alkali glasses. The temperatures of the glasses of the comparative examples No. 2 and No. 4 at the viscosity of $10^3$ poise are 1410° C. and 1430° C. respectively, whereas the temperatures of the glasses of examples Nos. 1-5 which have about the same values of $\alpha$ as these comparative examples are 1300° C., 1330° C., 1350° C., 1310° C. and 1320° C. respectively, which shows that the glasses of the second aspect of the invention, including these and other examples, have even better melt properties so that they are advantageous for the homogenizing step.

The glass for a photomask according to the second aspect of the invention can be produced in the same manner as in the glass according to the first aspect of the invention. In the melting step, it can be made seed-free and homogenized at a relatively low temperature range of about 1350°–1450° C. Further, the melt properties of the glass can be improved without requiring the expensive rare earth components such as $La_2O_3$ or $Sb_2O_3$ as in the glass of the first aspect of the invention so that the glass can be made from relatively low cost raw materials.

As described above, the glass of the first aspect of the invention which is the $SiO_2$-$B_2O_3$-$Al_2O_3$-MgO-PbO system glass of the specified composition is easy to melt and homogenize and has a good resistivity to the phase separation. A stable production of a transparent and homogeneous glass is therefore possible. Furthermore, since the glass has excellent heat resisting and refractory properties, chemical durability, ultraviolet transmittance and metal vapor deposition property, it is useful for glass for a photomask.

The glass of the second aspect of the invention which is the $SiO_2$-$B_2O_3$-$Al_2O_3$-MgO-BaO-ZnO-PbO system of the specified composition has the same excellent features as the glass of the first aspect of the invention and, in addition, has further improved melt properties. For these reasons, a homogeneous glass can be produced on stable and economical basis with a higher yield. This glass therefore is particularly useful for glass for a photomask and also is suitable for use as electronic devices and parts such as a stripe filter.

What is claimed is:

1. Glass for a photomask consisting, in weight percent, of 45 to 60% $SiO_2$, 0.5 to 12% $B_2O_3$, 10 to 22% $Al_2O_3$, 5 to 17% MgO, 0 to 5% CaO, 0 to 8% SRO, 1.5 to 15% BaO, 1.5 to 17% ZnO, 0.5 to 10% PbO, the total content of ZnO and PbO being at least 6%, 0 to 7% $Ta_2O_5$+$Nb_2O_5$+$La_2O_3$+$Gd_2O_3$+$Y_2O_3$+$Bi_2O_3$+$WO_3$, 0 to 5% $ZrO_2$+$TiO_2$, 0 to 2.5% $Na_2O$+$K_2O$+$Li_2O$, 0 to 0.5% $As_2O_3$ and 0 to 0.5% $Sb_2O_3$.

* * * * *